US00RE40007E

(19) United States
(12) Reissued Patent
Chen et al.

(10) Patent Number: US RE40,007 E
(45) Date of Reissued Patent: Jan. 22, 2008

(54) IN-SITU STRIP PROCESS FOR POLYSILICON ETCHING IN DEEP SUB-MICRON TECHNOLOGY

(75) Inventors: Horng-Wen Chen, Hsin Chu (TW); Chi-How Wu, Tainan (TW)

(73) Assignee: Taiwan Semiconductor Manufacturing Company, Ltd., Hsin-Chu (TW)

(21) Appl. No.: 10/650,886

(22) Filed: Aug. 28, 2003

Related U.S. Patent Documents

Reissue of:
(64) Patent No.: 6,283,131
Issued: Sep. 4, 2001
Appl. No.: 09/669,159
Filed: Sep. 25, 2000

(51) Int. Cl.
*B08B 7/02* (2006.01)
*H01L 21/302* (2006.01)

(52) U.S. Cl. ..... 134/1.2; 430/5; 438/725; 438/719; 438/717; 438/734; 438/736; 438/739

(58) Field of Classification Search ..... 134/1.2; 430/5; 438/725, 721, 719, 717, 734, 736, 438/739, 723, 724
See application file for complete search history.

(56) References Cited

U.S. PATENT DOCUMENTS 5,346,586 A * 9/1994 Keller ..... 438/694
5,382,316 A * 1/1995 Hills et al. ..... 216/67
5,767,018 A 6/1998 Bell
5,804,088 A 9/1998 McKee
5,885,902 A 3/1999 Blasingame et al.
5,976,769 A * 11/1999 Chapman ..... 430/316
6,037,266 A 3/2000 Tao et al.
6,130,166 A 10/2000 Yeh
6,156,485 A * 12/2000 Tang et al. ..... 430/313
6,306,560 B1 * 10/2001 Wang et al. ..... 430/316
6,348,405 B1 * 2/2002 Ohuchi ..... 438/636

* cited by examiner

*Primary Examiner*—George A. Goudreau
(74) *Attorney, Agent, or Firm*—Slater & Matsil, L.L.P.

(57) ABSTRACT

A new method of patterning the polysilicon layer in the manufacture of an integrated circuit device has been achieved. A polysilicon layer is provided overlying a semiconductor substrate. The polysilicon layer may overlie a gate oxide layer and thereby comprise the polysilicon gate for MOS devices. A hard mask layer is provided overlying the polysilicon layer. A resist layer is provided overlying the hard mask layer. The resist layer is patterned to form a resist mask the exposes a part of the hard mask layer. The polysilicon layer is patterned in a plasma dry etching chamber. First, the resist layer is optionally trimmed by etching. Second, the hard mask layer is etched where exposed by the resist mask to form a hard mask that exposes a part of the polysilicon layer. Third, the resist mask is stripped away. Fourth, polymer residue from the resist mask is cleaned away using a chemistry containing $CF_4$ gas. Fifth, the polysilicon layer is etched where exposed by the hard mask. After the polysilicon layer is so patterned in the dry plasma etch chamber, the hard mask layer is stripped away to complete the patterning of the polysilicon layer in the manufacture of the integrated circuit device.

55 Claims, 6 Drawing Sheets

IN-SITU STRIP PROCESS FOR POLYSILICON ETCHING IN DEEP SUB-MICRON TECHNOLOGY

Matter enclosed in heavy brackets [ ] appears in the original patent but forms no part of this reissue specification; matter printed in italics indicates the additions made by reissue.

BACKGROUND OF THE INVENTION (1) Field of the Invention

The invention relates to a method of fabricating semiconductor structures, and more particularly, to a method of patterning a polysilicon layer in the manufacture of an integrated circuit device.

(2) Description of the Prior Art

Polysilicon pattern definition remains a significant challenge in semiconductor manufacturing. The minimum width of the polysilicon layer determines the minimum transistor length of MOS technologies. Transistor switching speed and packing density depend heavily on the ability to reliably and repeatably manufacture transistors with very narrow polysilicon gates.

Referring now to FIG. 1, a cross-section of a partially completed prior art integrated circuit device is shown. A gate oxide layer 14 overlies a semiconductor substrate 10. A polysilicon layer 18 overlies the gate oxide layer 14. A hard mask layer 22 overlies the polysilicon layer 18. Finally, a photoresist layer 26 overlies the hard mask layer 22. Note that the photoresist layer 26 has been patterned by, for example, a photolithographic sequence of coating, exposure, and development.

Referring now to FIG. 7, the polysilicon layer 18 is patterned using the prior art sequence that is illustrated by the process flow chart. Note, first, that the prior art process etches the pattern of the photoresist layer 26 into the hard mask layer 22 in step 30. Second, the photoresist layer 26 is stripped away in step 34. Third, the pattern of the hard mask layer 22 is etched into the polysilicon layer 18 in step 38. Finally, the hard mask layer 22 is stripped away in step 42. Note that an intervening resist strip (step 34) necessitates the removal of the wafers from the etching chamber between the hard mask etch (step 30) and the gate etch (step 38).

Referring now to FIG. 2 and to FIG. 7, step 30, the photoresist layer 26 may be trimmed. This trimming step is performed to reduce the width of the photoresist layer 26 to a dimension that is smaller than the capability of the photolithographic exposure equipment. This trimming etch is performed in the plasma dry etch chamber and reduces the width of the patterned photoresist layer 26 to a dimension that will enable the final patterned polysilicon layer 18 to meet the critical dimension (CD) specifications for the manufacturing process.

Referring now to FIG. 3 and to FIG. 7, step 30, the pattern of the photoresist layer 26 is etched into the hard mask layer 22. This etching step is again performed in the plasma dry etch chamber.

Referring now to FIG. 4 and to FIG. 7, step 34, the photoresist layer 26 is stripped away. This photoresist layer 26 must be removed to improve the selectivity of the plasma dry etch process. Because the gate oxide layer 14 of the deep sub-micron process is very thin, the subsequent polysilicon etching step must have a high selectivity to the gate oxide. Removing the photoresist layer 26 prior to the polysilicon etch step 38 improves this selectivity. This is the reason that the hard mask layer 22 is used.

Of particular importance to the present invention is the fact that the semiconductor wafers must be removed from the plasma dry etch chamber during photoresist stripping. A separate photoresist stripping chamber is typically used to strip away this remaining photoresist. Following the photoresist strip, the wafers are then returned to the plasma dry etch chamber for the gate or polysilicon layer 18 etch step 38. This polysilicon layer 18 is thereby etched in a photoresist free process that is herein called an ex-situ process.

The additional wafer handling and process equipment required to remove the photoresist layer 26 increases the cycle time and the processing cost. In addition, the wafers are open to increased contamination due to the handling and the additional processing chamber. The additional processing chamber also makes controlling processing parameters more difficult. Finally, additional inspections and CD measurement steps may be added to insure that the additional handling and process set-ups are within specification. This also adds to the processing cost and cycle time.

Referring now to FIG. 5 and to FIG. 7, step 38, the pattern of the hard mask layer 22 is etched into the polysilicon layer 18. This step is performed in the plasma dry etch chamber after the photoresist strip step 34.

Referring finally to FIG. 6 and to FIG. 7, step 42, the hard mask layer is stripped away to complete the patterning of the polysilicon layer 18. The wafers are removed from the plasma dry etch chamber for this processing step 42. The hard mask stripping may comprise a wet etch process.

Several prior art approaches disclose methods to pattern polysilicon in the manufacture to an integrated circuit device. U.S. Pat. No. 5,767,018 to Bell teaches a method to etch a polysilicon pattern where an anti-reflective coating (ARC) is used. Pitting problems are eliminated. In one embodiment, a passivation layer is formed on the sidewalls of the patterned ARC layer prior to polysilicon etching. In a second embodiment, the passivation layer is formed on the ARC layer sidewalls during the polysilicon etch. U.S. Pat. No. 6,037,266 to Tao et al discloses a method to etch a polysilicon pattern. A bottom anti-reflective coating (BARC) is used. The BARC layer and an oxide layer are etched to form a pattern over the polysilicon layer. The BARC layer is then stripped away using a biased $O_2$ plasma. The polysilicon layer is then etched using the oxide layer as a hard mask. U.S. Pat. No. 5,346,586 to Keller teaches a method to etch a polysilicon pattern. A silicide layer is used overlying the polysilicon layer. An oxide layer overlies the silicide layer. The oxide layer is patterned using a hard mask layer. The photoresist layer is then removed using an ozone plasma strip. The silicide layer is etched. Finally, the polysilicon layer is etched. U.S. Pat. No. 5,885,902 to Blasingame et al discloses a method to etch an anti-reflective coating (ARC) layer using an inert gaseous plasma containing helium, nitrogen, or a mixture thereof.

SUMMARY OF THE INVENTION

A principal object of the present invention is to provide an effective and very manufacturable method of patterning a polysilicon layer in the manufacture of an integrated circuit device.

A further object of the present invention is to provide a method to pattern the polysilicon layer that reduces process cycle time in the processing sequence.

Another further object of the present invention is to provide a method to pattern the polysilicon layer that reduces wafer handling.

A yet further object of the present invention is to provide a method to pattern the polysilicon layer by stripping away the photoresist layer in-situ to the polysilicon dry plasma etch chamber.

A still further object of the present invention is to provide a method to eliminate photoresist polymer residue from the polysilicon dry etch chamber.

In accordance with the objects of this invention, a new method of patterning the polysilicon layer in the manufacture of an integrated circuit device has been achieved. A polysilicon layer is provided overlying a semiconductor substrate. The polysilicon layer may overlie a gate oxide layer and would thereby comprise the polysilicon gate for MOS devices. A hard mask layer is provided overlying the polysilicon layer. A resist layer is provided overlying the hard mask layer. The resist layer is patterned to form a resist mask the exposes a part of the hard mask layer. The polysilicon layer is patterned in a plasma dry etching chamber. First, the resist layer is optionally trimmed by etching. Second, the hard mask layer is etched where exposed by the resist mask to form a hard mask that exposes a part of the polysilicon layer. Third, the resist mask is stripped away. Fourth, polymer residue from the resist mask is cleaned away using a chemistry containing $CF_4$ gas. Fifth, the polysilicon layer is etched where exposed by the hard mask. After the polysilicon layer is so patterned in the dry plasma etch chamber, the hard mask layer is stripped away to complete the patterning of the polysilicon layer in the manufacture of the integrated circuit device.

BRIEF DESCRIPTION OF THE DRAWINGS

In the accompanying drawings forming a material part of this description, there is shown.

DESCRIPTION OF THE PREFERRED EMBODIMENTS

The embodiment discloses the application of the present invention to the patterning of the polysilicon layer in the manufacture of an integrated circuit device. It should be clear to those experienced in the art that the present invention can be applied and extended without deviating from the scope of the present invention.

Figure 1:
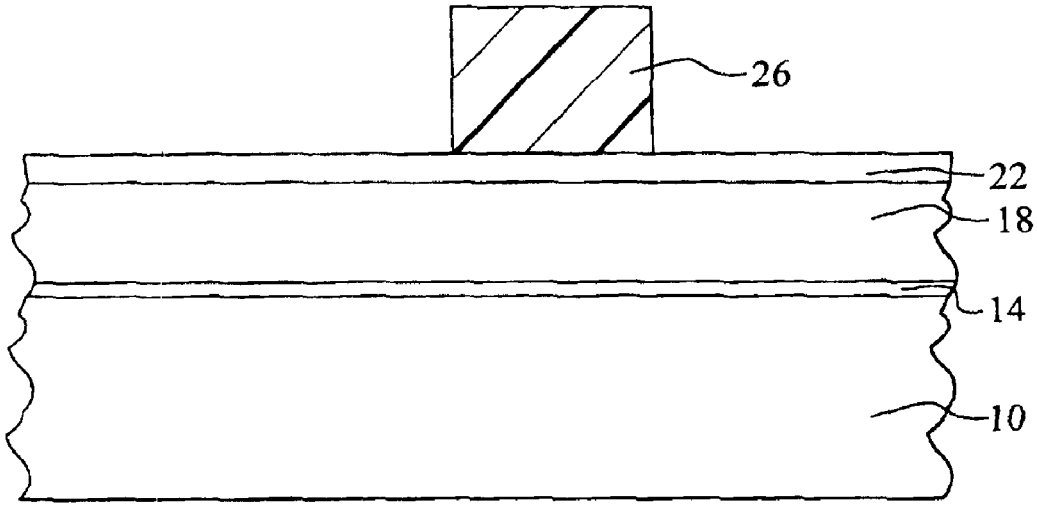
FIG. 1 Prior Art
FIGS. 1 through 6 illustrate in cross-section a partially completed prior art integrated circuit device.
Figure 2:
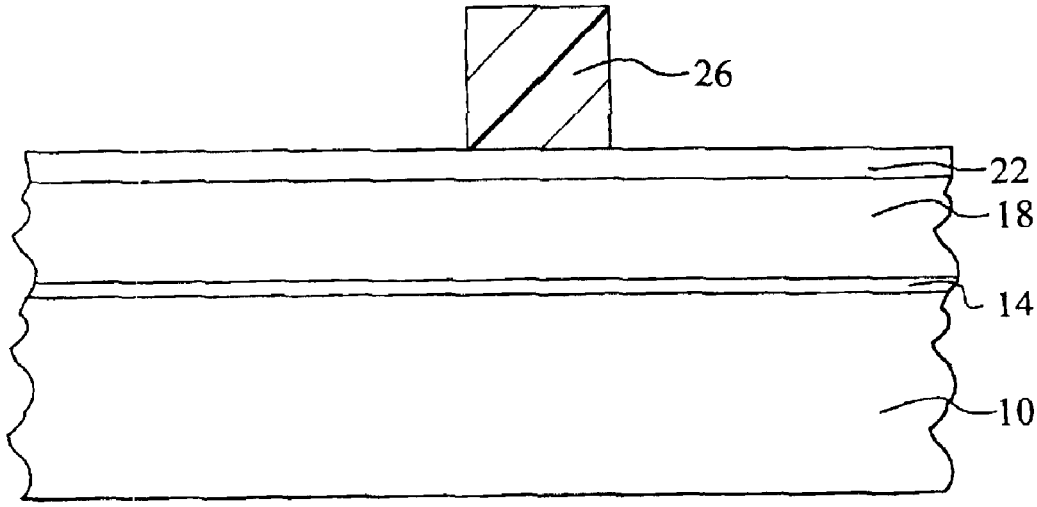
FIG. 2 Prior Art
Figure 3:
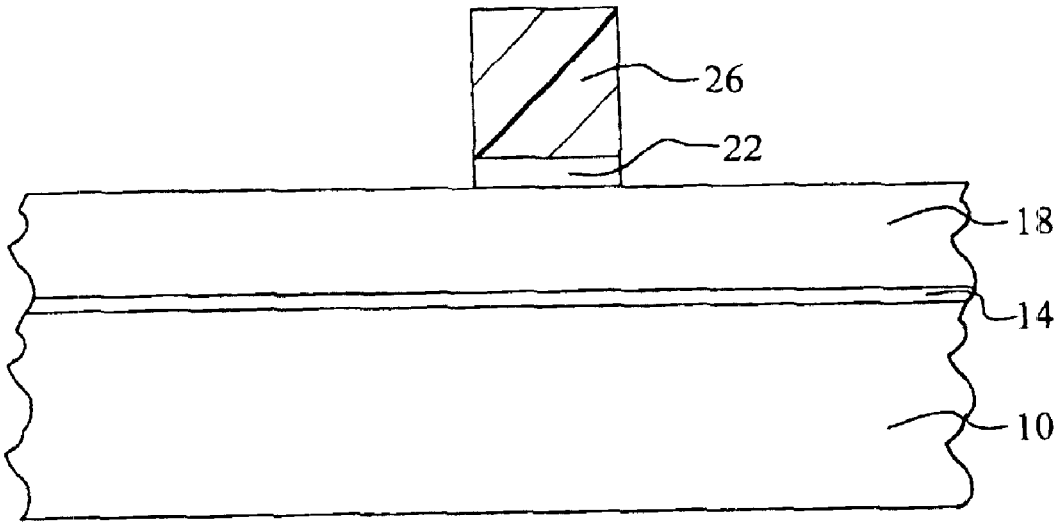
FIG. 3 Prior Art
Figure 4:
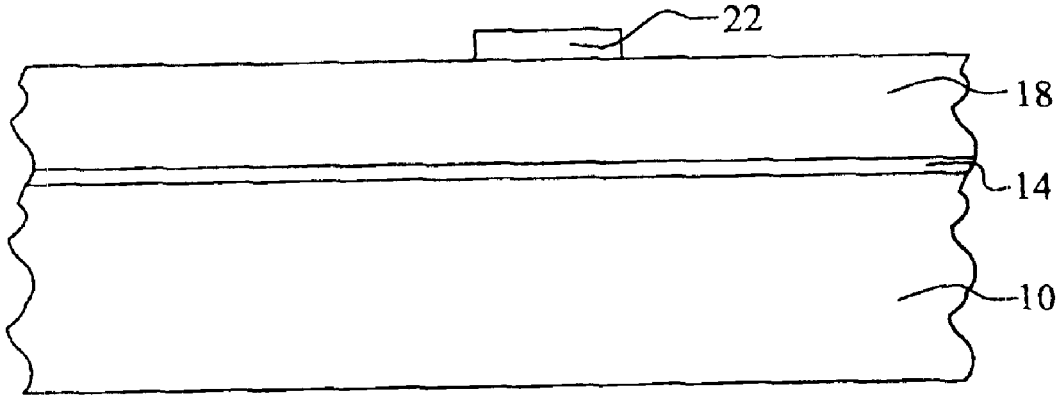
FIG. 4 Prior Art
Figure 5:
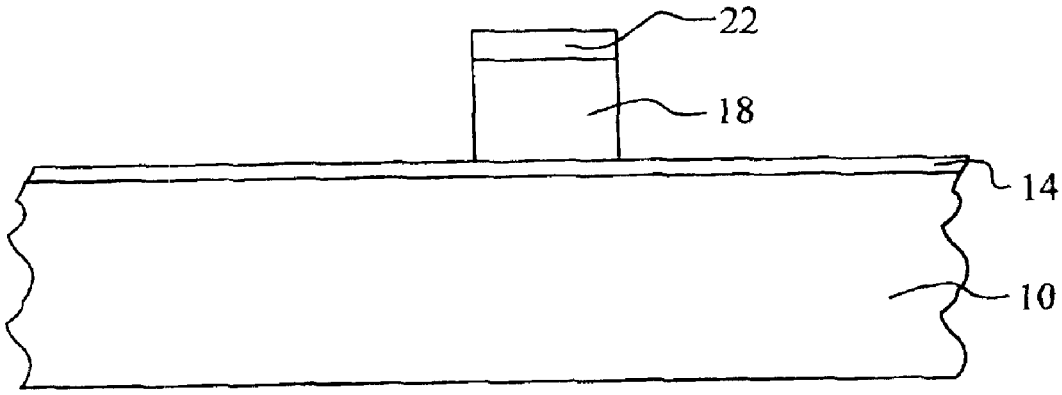
FIG. 5 Prior Art
Figure 6:
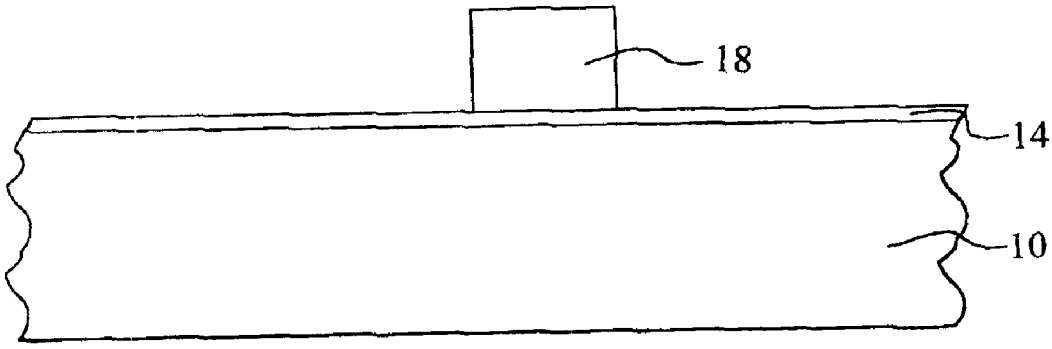
FIG. 6 Prior Art
Figure 7:
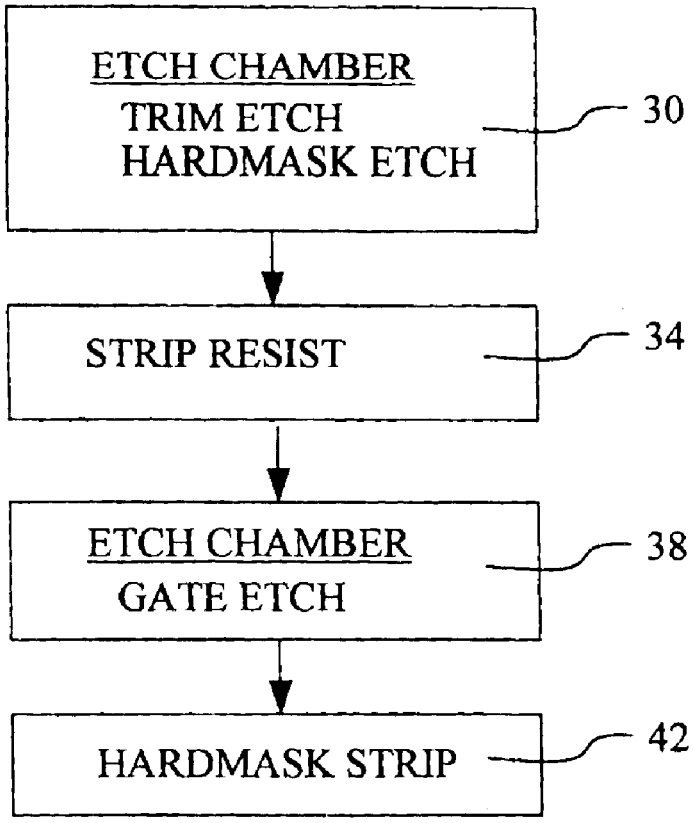
FIG. 7 Prior Art
FIG. 7 illustrates the process flow sequence for the prior art polysilicon patterning method.
Figure 8:
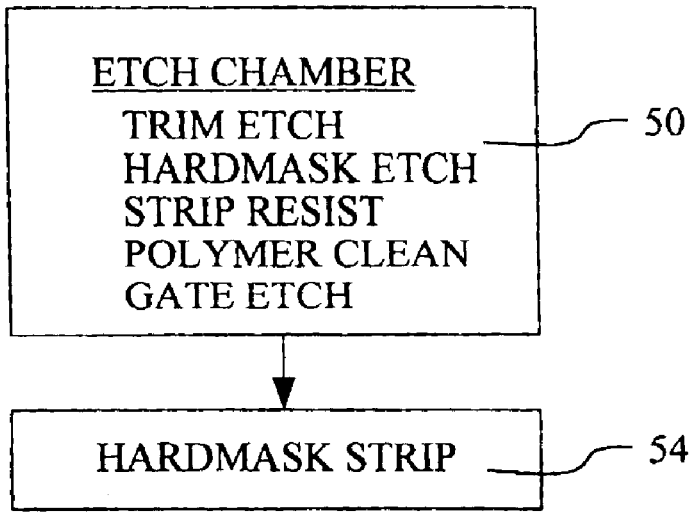
FIG. 8 illustrates the process flow sequence for the preferred embodiment of the method of the present invention.

Referring now particularly to FIG. 8, a process flow sequence for the preferred embodiment of the present invention is shown. This process flow is of particular importance to the present invention. In the preferred process flow, the resist trim etch, hard mask etch, resist strip, and gate etch are combined into a single process step 50 within a dry plasma etch chamber. The novel method allows these processing components to be conducted using a continuous dry plasma etching recipe through the sequential introduction of gases and control of parameters. The cost, time consumption, and contamination that are introduced by the excessive wafer handling of the prior art process are thereby eliminated. After the polysilicon layer, herein called the gate, is etched, the wafers may be removed from the dry plasma etch chamber. The hard mask layer is then stripped in step 54.

As in the prior art process, the resist trim step is optional to the method of the invention. The resist trim step may be used to reduce the line width of the photoresist layer beyond the capability limits of the photolithographic equipment.

Of particular importance to the process flow is in the inclusion within the etching step 50 of a polymer clean step. After the resist layer is stripped away, residual organic polymer from the resist material may be present in the chamber and on the sidewalls of the hard mask. A polymer cleaning is therefore an essential aspect of the present invention. The organic polymer is removed using a cleaning chemistry containing $CF_4$ gas. The chamber and the integrated circuit device is thereby cleaned of residual organic polymer material prior to the critical polysilicon gate etch.

Figure 9:
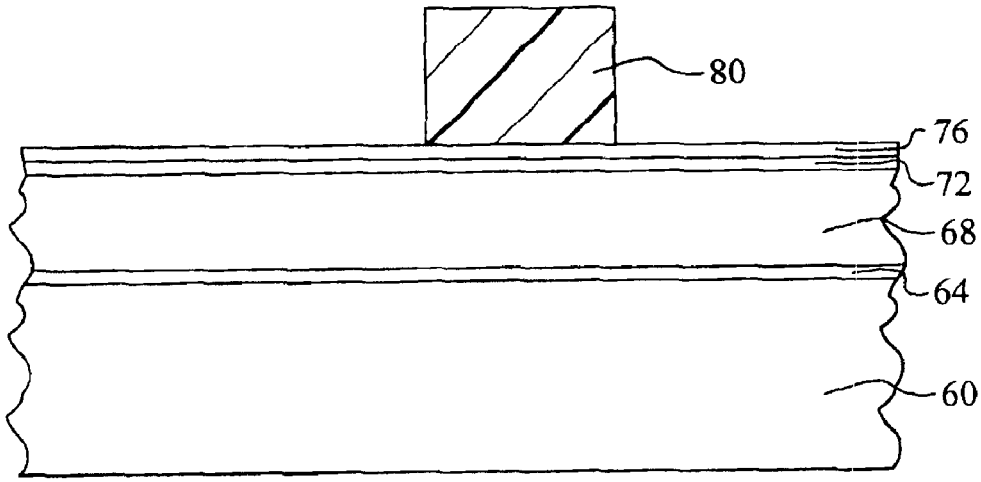
FIGS. 9 through 12 illustrate in cross-section the preferred embodiment of the present invention.

Referring now to FIG. 9, a cross-section of the partially completed device of the present invention method is shown. A semiconductor substrate 60 is provided. The semiconductor substrate preferably comprises monocrystalline silicon. A gate oxide layer 64 is provided overlying the semiconductor substrate 60. The gate oxide layer 64 is very thin in a deep sub-micron MOS process. For example, the gate oxide layer 64 is formed by conventional means to about 20 Angstroms.

A polysilicon layer 68 is provided overlying the gate oxide layer 64. The polysilicon layer 68 may be doped or undoped and is formed by conventional means. As an example, the polysilicon of the preferred embodiment is undoped and has a thickness of between about 1,500 Angstroms and 2,500 Angstroms.

A hard mask layer 72 is provided overlying the polysilicon layer 68. The hard mask layer 72 will subsequently be patterned to form a hard mask overlying the polysilicon layer 68 for the polysilicon etch step. The hard mask layer 72 preferably comprises silicon oxynitride with a thickness of between about 300 Angstroms and 500 Angstroms. Silicon dioxide could be used as the hard mask layer 72 in the present invention.

A silicon dioxide layer 76 is provided overlying the hard mask layer 72. The silicon dioxide layer 76 is used as a buffer layer to gain etching selectivity during the polysilicon etching. The silicon dioxide layer 76 is optional to the present invention.

A resist layer 80 is provided overlying the silicon dioxide layer 76. The resist layer 80 preferably comprises a conventional photoresist material that has been applied, exposed and developed to form a pattern. The resist layer 80 thereby contains the pattern that will be transferred, first, to the hard mask layer 72 and, second, to the polysilicon layer 68. As an example, the preferred resist layer 80 comprises a deep ultra-violet (DUV) photoresist, such as ShinEtsu 233DT. The photoresist material is spin coated overlying the wafer to a thickness of between about 3,500 Angstroms and 5,000 Angstroms. Following bake, the resist layer has a thickness of between about 3,000 Angstroms and 4,700 Angstroms. The resist layer 80 is patterned, for example, to a minimum line with critical dimension (CD) of between about 0.151 microns and 0.169 microns.

Figure 10:
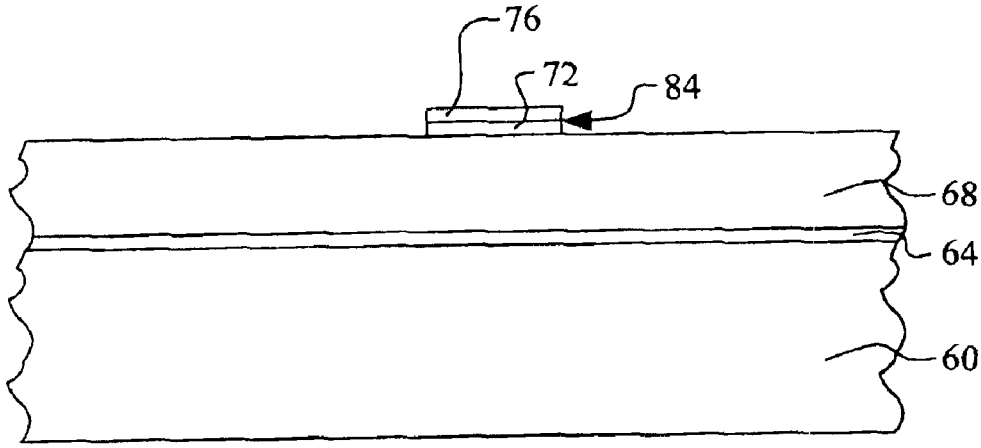

Referring now to FIG. 10, several important features of the present invention are presented. The semiconductor wafers are loaded into the dry etching chamber as outlined in the process flow step 50. In the preferred process example, the dry plasma etching chamber comprises an Applied Materials DPS-POLY system. The overall dry plasma etching recipe sequence, shown as step 50 of FIG. 8, comprises a series of recipe steps. Each recipe step completes a step in the process of transferring the resist layer pattern into the polysilicon layer.

The first recipe step comprises the trim etch. As in the prior art process, the trimming step is not considered an essential aspect of the method of the present invention. In the trimming etch, the resist layer 80 is etched to reduce the line widths of the resist layer 80. In the example process, the minimum pre-trim resist layer 80 width is between about 0.151 microns and 0.169 microns. The final after etch polysilicon CD is specified at between about 0.145 microns and 0.125 microns. Since the final polysilicon CD is about 0.025 microns less than the available resist CD, it is necessary to trim back the width of the resist layer 80.

The trimming etch recipe preferably comprises a combination of gases. In the preferred embodiment, HBr gas is flowing at a rate of between about 60 sccm and 100 sccm, Ar gas is flowing at a rate of between about 40 sccm and 80 sccm, and $\mathbf{0}_2$ gas is flowing at a rate of between about 2 sccm and 10 sccm. The chamber pressure is between about 4 milliTorr and 15 milliTorr. A source power of between about 200 Watts and 400 Watts and a bias power of between about 40 Watts and 80 Watts are used. The trimming etch is performed for between about 20 seconds and 60 seconds. The trimming etch reduces the width of the resist layer 80 prior to transferring the pattern to the hard mask layer 72.

Following the trim etch, the hard mask layer 72 is etched. If the silicon dioxide layer 76 is used, it is etched with the hard mask layer. The hard mask etch comprises a combination of gases. In the preferred embodiment, $CF_4$ gas is flowing at a rate of between about 10 sccm and 30 sccm and Ar gas is flowing at a rate of between about 140 sccm and 160 sccm. The chamber pressure is maintained at between about 8 milliTorr and 12 milliTorr. The source power is controlled at between about 550 Watts and 650 Watts while the bias power is controlled at between about 40 Watts and 80 Watts. The hard mask layer 72 is etched using an endpoint detection that detects when the hard mask layer 72 has been etched through.

Following the hard mask etch, the resist layer 80 is stripped away. The ability to perform this step within the same dry etch plasma chamber is an important feature of the present invention. The resist layer 80 is removed by flowing $O_2$ gas at a rate of between about 40 sccm and 60 sccm. A chamber pressure of between about 4 milliTorr and 15 milliTorr is maintained. The source power is controlled at between about 30 Watts and 500 Watts, while the bias power is controlled at between about 80 Watts and 100 Watts. The strip is stopped using an endpoint detection that detects that the photoresist layer 80 is no longer present.

Following the resist strip step, it is likely that organic polymer residue remains from the photoresist material. This residue will coat the interior of the dry plasma etching chamber and may adhere to the sidewalls of the hard mask 72 and 76 as shown by 84 in FIG. 10. It is critical to the method of the present invention that the resist stripping step be followed by a polymer cleaning step. The polymer clean removes any organic polymer residue from the chamber and from the sidewalls of the hard mask 72 and 76.

The polymer clean step is accomplished by flowing $CF_4$ gas at a rate of between about 60 sccm and 100 sccm. The chamber pressure is maintained at between about 4 milliTorr and 15 milliTorr. The source power is controlled at between about 300 Watts and 500 Watts, while the bias power is controlled at between about 30 Watts and 50 Watts. The polymer clean is performed for between about 5 seconds and 15 seconds. The polymer cleaning step keeps the chamber clean prior to each polysilicon etch process.

Figure 11:
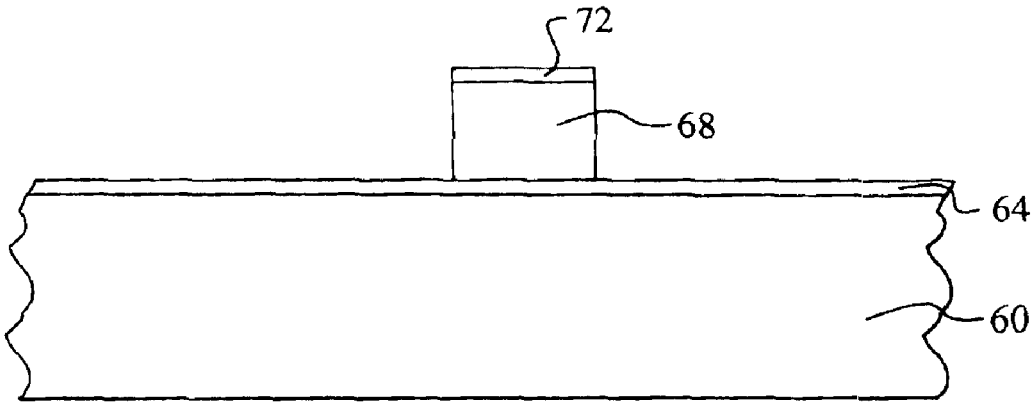

Referring now to FIG. 11, the polysilicon layer 68 is now etched using two recipe steps comprising, first, a main etch (ME) and, second, an overetch (OE). In the main etch, the polysilicon layer 68 is etched using a gas combination of HBr, $Cl_2$, and He—$O_2$. The main etch is stopped using an endpoint detection method that detects when the polysilicon layer 68 has been etched through. The overetch recipe uses a gas combination of HBr and He—$O_2$ for a controlled time period to insure that the remaining polysilicon layer 68 will be free of stringers and shorts.

The main etch comprises HBr flowing at a rate of between about 160 sccm and 200 sccm, $Cl_2$ flowing at a rate of between about 10 sccm and 30 sccm, and He—$O_2$ flowing at a rate of between about 2 sccm and 10 sccm. The chamber pressure is maintained at between about 4 milliTorr and 15 milliTorr. The source power is controlled at between about 550 Watts and 650 Watts. The bias power is controlled at between about 30 Watts and 50 Watts.

The overetch recipe comprises HBr flowing at a rate of between about 130 sccm and 150 sccm and He—$O_2$ flowing at a rate of between about 4 sccm and 6 sccm. The chamber pressure is maintained at between about 60 milliTorr and 100 milliTorr. The source power is controlled at between about 300 Watts and 500 Watts, while the bias power is controlled at between about 60 Watts and 80 Watts. The overetch is performed for between about 60 seconds and 100 seconds. Following the polysilicon etch, the device cross-section appears as shown in FIG. 11. The silicon dioxide layer 76 is etched away during the polysilicon etch step.

Figure 12:
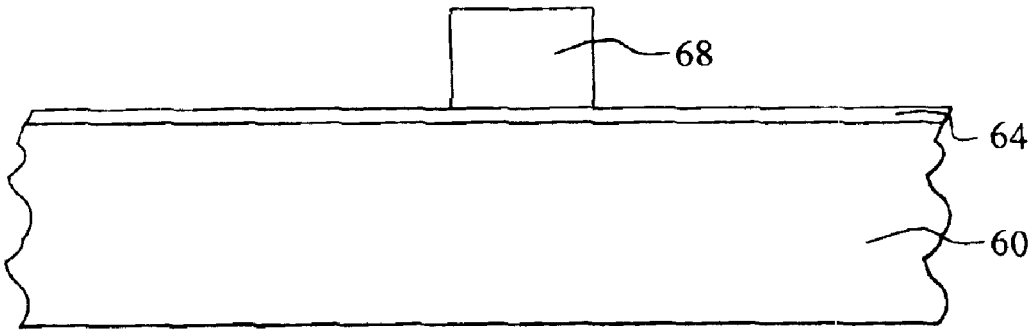

Referring now to FIG. 12, the hard mask is stripped away to complete the patterning of the polysilicon layer 68. The wafers are removed from the dry plasma etch chamber to perform the hard mask strip. In the preferred embodiment, the hard mask layer 72 comprises silicon oxynitride. This silicon oxynitride layer 72 is preferably removed using a wet etch comprising $H_3PO_4$.

The method of the present invention, using the in-situ stripping of the photoresist layer, has been demonstrated on a 0.15 micron process. The method demonstrates stable after etch inspection (AEI) CD performance. The three-sigma variation is between about 4 nanometers and 8 nanometers. SEM and X-SEM profiles, after polysilicon gate etching, demonstrate excellent vertical profiles with no pitting, trenching, or residue problems. In addition, the method saves about 4 hours compared to the prior art approach.

As shown in the preferred embodiments, the present invention provides a very manufacturable process for patterning the polysilicon layer in an integrated circuit device. The present invention saves cycle time and reduces costs. The present invention has been successfully demonstrated on a 0.15 micron process. The novel approach allows photoresist to be stripped away in the dry plasma etch chamber. The polymer cleaning step eliminates problems associated with resist residue build-up in the chamber or on hard mask sidewalls.

While the invention has been particularly shown and described with reference to the preferred embodiments thereof, it will be understood by those skilled in the art that various changes in form and details may be made without departing from the spirit and scope of the invention.

What is claimed is:

1. A method to pattern a polysilicon layer in the manufacture of an integrated circuit device comprising:

providing a polysilicon layer overlying a semiconductor substrate;

providing a hard mask layer overlying said polysilicon layer;

providing a resist layer overlying said hard mask layer;

patterning said resist layer to form a resist mask that exposes a part of said hard mask layer;

patterning said polysilicon layer wherein said patterning is performed sequentially in a dry plasma etch chamber and wherein said patterning comprises:

etching said hard mask layer exposed by said resist mask to form a hard mask that exposes a part of said polysilicon layer;

thereafter stripping away said resist mask;

thereafter cleaning away polymer residue from said hard mask wherein said cleaning away comprises a chemistry containing $CF_4$ gas; and thereafter etching said polysilicon layer exposed by said hard mask; and stripping away said hard mask to complete the patterning of said polysilicon layer in the manufacture of the integrated circuit device.

2. The method according to claim 1 wherein said hard mask layer comprises silicon oxynitride.

3. The method according to claim 1 wherein said step of etching said hard mask layer comprises a chemistry containing $CF_4$ gas.

4. The method according to claim 1 wherein said step of stripping away said resist mask comprises a chemistry containing $O_2$ gas.

5. The method according to claim 1 wherein said step of etching said polysilicon layer comprises a main etch step followed by an overetch step.

6. The method according to claim 1 wherein said step of etching said polysilicon layer comprises a chemistry of: HBr gas, $Cl_2$ gas, He—$O_2$ gas, and combinations thereof.

7. The method according to claim 1 further comprising providing a silicon dioxide layer overlying said hard mask layer and underlying said resist layer.

8. The method according to claim 1 further comprising etching said resist layer to trim said resist layer prior to said step of etching said hard mask layer wherein said etching of said resist layer is performed in said dry plasma etching chamber.

9. The method to pattern a polysilicon layer in the manufacture of an integrated circuit device comprising:

providing a polysilicon layer overlying a semiconductor substrate;

providing a hard mask layer overlying said polysilicon layer;

providing a silicon dioxide layer said hard mask layer;

providing a resist layer overlying said hard mask layer;

patterning said resist layer to form a resist mask that exposes a part of said hard mask layer;

patterning said polysilicon layer wherein said patterning is performed sequentially in a dry plasma etch chamber and wherein said patterning comprises:

etching said resist mask to trim said resist mask;

thereafter etching said hard mask layer exposed by said resist mask to form a hard mask that exposes a part of said polysilicon layer;

thereafter stripping away said resist mask;

thereafter cleaning away polymer residue from said resist mask wherein said cleaning away comprises a chemistry containing $CF_4$ gas; and thereafter etching said polysilicon layer exposed by said hard mask; and stripping away said hard mask to complete the patterning of said polysilicon layer in the manufacture of the integrated circuit device.

10. The method according to claim 9 wherein said hard mask layer comprises silicon oxynitride.

11. The method according to claim 9 wherein said step of etching said resist mask to trim said resist mask comprises a chemistry containing $O_2$ gas.

12. The method according to claim 9 wherein said step of etching said hard mask layer comprises a chemistry of $CF_4$ gas.

13. The method according to claim 9 wherein said step of stripping away said resist layer comprises a chemistry containing $O_2$ gas.

14. The method according to claim 9 wherein said step of etching said polysilicon layer comprises a main etch step followed by an overetch step.

15. The method according to claim 9 wherein said step of etching said polysilicon layer comprises a chemistry of: HBr gas, $Cl_2$ gas, He—$O_2$ gas, and combinations thereof.

16. A method to pattern a polysilicon layer in the manufacture of an integrated circuit device comprising:

providing a gate oxide overlying a semiconductor substrate;

providing a polysilicon layer overlying said gate oxide layer;

providing a silicon oxynitride layer overlying said polysilicon layer;

providing a silicon dioxide layer overlying said silicon oxynitride layer;

providing a resist layer overlying said silicon dioxide layer;

patterning said resist layer to form a resist mask that exposes a part of said silicon dioxide layer;

patterning said polysilicon layer wherein said patterning is performed sequentially in a dry plasma etch chamber and wherein said patterning comprises:

etching said resist mask to trim said resist mask;

thereafter etching said silicon dioxide layer and said silicon oxynitride layer exposed by said resist mask to form a hard mask that exposes a part of said polysilicon layer;

thereafter stripping away said resist mask;

thereafter cleaning away polymer residue from said resist mask wherein said cleaning away comprises a chemistry containing $CF_4$ gas; and thereafter etching said polysilicon layer exposed by said hard mask wherein said etching comprises a main etch step followed by an overetch step; and stripping away said hard mask to complete the patterning of said polysilicon layer in the manufacture of the integrated circuit device.

17. The method according to claim 16 wherein said step of etching said silicon dioxide layer and said silicon oxynitride layer comprises a chemistry of $CF_4$ gas.

18. The method according to claim 16 wherein said step of stripping away said resist layer comprises a chemistry containing $O_2$ gas.

19. The method according to claim 16 wherein said step of etching said polysilicon layer comprises a chemistry of: HBr gas, $Cl_2$ gas, He—$O_2$ gas, and combinations thereof.

*20. A method of forming a semiconductor device, the method comprising:*

*providing a semiconductor substrate with a conductive layer formed thereon;*

*providing a hard mask layer above said conductive layer, said hard mask layer comprising silicon oxynitride;*

*providing a buffer layer above said hard mask layer;*

*providing a resist layer above said buffer layer;*

*patterning said resist layer to form a resist mask that exposes a part of said buffer layer; and*

*patterning said conductive layer in a dry plasma etch chamber, said patterning comprising:*

*etching said hard mask layer and said buffer layer exposed by said resist mask to form a hard mask that exposes a part of said conductive layer;*

*thereafter stripping away said resist mask; and*

*thereafter etching said conductive layer exposed by said hard mask.*

*21. The method of claim 20 wherein said buffer layer comprises an oxide.*

*22. The method of claim 20 wherein said buffer layer comprises silicon dioxide.*

*23. The method of claim 20 wherein said step of etching said hard mask layer comprises a chemistry containing $CF_4$ gas.*

*24. The method of claim 20 wherein said step of etching said conductive layer comprises a main etch step followed by an overetch step.*

*25. The method of claim 20 further comprising etching said resist layer to trim said resist layer prior to said step of etching said hard mask layer wherein said etching of said resist layer is performed in said dry plasma etch chamber.*

*26. A method for forming a semiconductor device, the method comprising:*

*providing a polysilicon layer overlying a semiconductor substrate;*

*providing a hard mask layer overlying said polysilicon layer;*

*providing a resist layer overlying said hard mask layer;*

*patterning said resist layer to form a resist mask that exposes a part of said hard mask layer; and*

*patterning said polysilicon layer in a dry plasma etch chamber and wherein said patterning comprises:*

*etching said hard mask layer exposed by said resist mask to form a hard mask that exposes a part of said polysilicon layer;*

*stripping away said resist mask in a first process step;*

*removing polymer residue resulting from said stripping step in a second process step; and*

*etching said polysilicon layer exposed by said hard mask.*

*27. The method of claim 26 wherein the step of patterning said polysilicon layer includes stripping away said hard mask.*

*28. The method of claim 26 further comprising cleaning away polymer residue from said hard mask after stripping away said resist mask.*

*29. The method of claim 26 wherein said hard mask layer comprises silicon oxynitride.*

*30. The method of claim 26 wherein the step of etching said hard mask layer comprises a chemistry containing $CF_4$ gas.*

*31. The method of claim 26 wherein said step of etching said polysilicon layer comprises a main etch step followed by an overetch step.*

*32. The method of claim 26 further comprising etching said resist layer to trim said resist layer prior to said step of etching said hard mask layer wherein said etching of said resist layer is performed in said dry plasma etch chamber.*

*33. A method for forming a semiconductor device, the method comprising:*

*providing a wafer having a substrate, a first layer formed on the substrate, a hard mask layer formed on the first layer, a buffer layer formed on said hard mask layer, and a resist layer formed on the buffer layer;*

*patterning said hard mask layer and said buffer layer to form a hard mask that exposes a part of said first layer;*

*removing said resist layer; and*

*patterning said first layer by etching said first layer and removing said hard mask layer and said buffer layer.*

*34. The method of claim 33 wherein the steps of patterning said hard mask layer, removing said resist layer, and patterning said first layer are performed in a dry plasma etch chamber.*

*35. The method of claim 33 wherein the step of patterning said hard mask layer includes etching the hard mask layer and the buffer layer.*

*36. The method of claim 35 wherein said step of etching said hard mask layer comprises a chemistry containing $CF_4$ gas.*

*37. The method of claim 33 wherein said step of etching said first layer comprises a main etch step followed by an overetch step.*

*38. The method of claim 33 wherein the step of patterning said hard mask layer includes patterning a resist layer.*

*39. The method of claim 38 further comprising etching said resist layer to trim said resist layer prior to said step of etching said hard mask layer wherein said etching of said resist layer is performed in said dry plasma etch chamber.*

*40. The method of claim 33 wherein said hard mask layer comprises silicon oxynitride.*

*41. The method of claim 33 wherein said buffer layer comprises an oxide.*

*42. The method of claim 33 wherein said buffer layer comprises silicon dioxide.*

*43. A method of forming a semiconductor device, the method comprising:*

*providing a semiconductor substrate with a conductive layer formed thereon;*

*providing a hard mask layer above said conductive layer;*

*providing a resist layer above said hard mask layer;*

*patterning said resist layer to form a resist mask that exposes a part of said hard mask layer; and*

*patterning said conductive layer in a dry plasma etch chamber, said patterning comprising:*

*etching said hard mask layer exposed by said resist mask to form a hard mask that exposes a part of said conductive layer;*

*thereafter stripping away said resist mask using a first chemistry;*

*thereafter removing polymer residue using a second chemistry different from the first chemistry; and*

*thereafter etching said conductive layer exposed by said hard mask.*

*44. The method of claim 43 wherein said hard mask layer comprises silicon oxynitride.*

*45. The method of claim 43 wherein said step of etching said hard mask layer comprises a chemistry containing $CF_4$ gas.*

*46. The method of claim 43 wherein said step of etching said conductive layer comprises a main etch step followed by an overetch step.*

*47. The method of claim 43 further comprising etching said resist layer to trim said resist layer prior to said step of etching said hard mask layer wherein said etching of said resist layer is performed in said dry plasma etch chamber.*

*48. A method for forming a semiconductor device, the method comprising:*

*providing a wafer having a substrate, a first layer formed on the substrate, a hard mask layer formed on the first layer, a buffer layer formed on said hard mask layer, and a resist layer formed on the buffer layer;*

*patterning said hard mask layer to form a hard mask that exposes a part of said first layer;*

*removing said resist layer; and*

*patterning said first layer by etching said first layer and removing said hard mask layer.*

*49. The method of claim 48 wherein the steps of patterning said hard mask layer, removing said resist layer, and patterning said first layer are performed in a dry plasma etch chamber.*

*50. The method of claim 48 wherein the step of patterning said hard mask layer includes etching the hard mask layer.*

*51. The method of claim 50 wherein said step of etching said hard mask layer comprises a chemistry containing* $CF_4$ *gas.*

*52. The method of claim 48 wherein said step of etching said first layer comprises a main etch step followed by an overetch step.*

*53. The method of claim 48 wherein the step of patterning said hard mask layer includes patterning a resist layer.*

*54. The method of claim 53 further comprising etching said resist layer to trim said resist layer prior to said step of etching said hard mask layer wherein said etching of said resist layer is performed in said dry plasma etch chamber.*

*55. The method of claim 48 wherein said hard mask layer comprises silicon oxynitride.*

* * * * *